(12) United States Patent
Brugger et al.

(10) Patent No.: US 9,190,310 B2
(45) Date of Patent: Nov. 17, 2015

(54) GROUNDED CHUCK

(75) Inventors: Michael Brugger, Millstatt (AT); Otto Lach, Treffen (AT)

(73) Assignee: LAM RESEARCH AG, Villach (AT)

( * ) Notice: Subject to any disclaimer, the term of this patent is extended or adjusted under 35 U.S.C. 154(b) by 1518 days.

(21) Appl. No.: 12/761,713

(22) Filed: Apr. 16, 2010

(65) Prior Publication Data
US 2011/0254236 A1  Oct. 20, 2011

(51) Int. Cl.
*B23B 31/18* (2006.01)
*H01L 21/683* (2006.01)
*H01L 21/687* (2006.01)

(52) U.S. Cl.
CPC ...... *H01L 21/6838* (2013.01); *H01L 21/68728* (2013.01); *H01L 21/68785* (2013.01); *H01L 21/68792* (2013.01); *Y10T 279/18* (2015.01); *Y10T 279/20* (2015.01); *Y10T 279/3493* (2015.01)

(58) Field of Classification Search
CPC ............... H01L 21/6838; H01L 21/68728; H01L 21/68785
USPC ............... 279/106, 157; 414/937; 428/67
See application file for complete search history.

(56) References Cited

U.S. PATENT DOCUMENTS

| | | | |
|---|---|---|---|
| 4,213,698 A * | 7/1980 | Firtion et al. | 355/77 |
| 4,345,836 A * | 8/1982 | Phillips | 355/53 |
| 4,903,717 A | 2/1990 | Sumnitsch | |
| 5,421,056 A * | 6/1995 | Tateyama et al. | 15/302 |
| 5,431,421 A * | 7/1995 | Thompson et al. | 279/139 |
| 5,513,668 A | 5/1996 | Sumnitsch | |
| 6,374,836 B1 * | 4/2002 | Oroku | 134/153 |
| 6,435,200 B1 | 8/2002 | Langen | |
| 6,536,454 B2 | 3/2003 | Lindner | |
| 6,540,597 B1 * | 4/2003 | Ohmori | 451/443 |
| 6,874,790 B2 * | 4/2005 | Sundkvist | 279/35 |
| 7,335,090 B2 | 2/2008 | Takahashi | |
| 7,354,481 B2 * | 4/2008 | Okuno et al. | 118/503 |
| 2003/0230729 A1 * | 12/2003 | Novak et al. | 250/492.2 |
| 2006/0156981 A1 | 7/2006 | Fondurulia et al. | |
| 2010/0003904 A1 * | 1/2010 | Duescher | 451/259 |

FOREIGN PATENT DOCUMENTS

| | | |
|---|---|---|
| EP | 1 077 473 | 2/2001 |
| KR | 100734671 B1 | 6/2007 |
| KR | 1020090121147 | 11/2009 |

OTHER PUBLICATIONS

Written Opinion of the International Searching Authority, dated Oct. 16, 2012, from corresponding PCT application.

* cited by examiner

*Primary Examiner* — Sunil K Singh
*Assistant Examiner* — Chwen-Wei Su
(74) *Attorney, Agent, or Firm* — Young & Thompson

(57) ABSTRACT

Improved reduction of static charge in spin chucks is achieved by providing one or more pin assemblies which are formed from chemically inert material and which include an electrically conductive inlay.

17 Claims, 2 Drawing Sheets

GROUNDED CHUCK

BACKGROUND OF THE INVENTION

1. Field of the Invention

The invention relates to methods and apparatus for treating surfaces of articles, such as semiconductor wafers, adapted to reduce buildup of electrostatic charge.

2. Description of Related Art

Semiconductor wafers undergo a variety of wet processing stages during manufacture of integrated circuits. To accommodate such processes, a single wafer may be supported in relation to one or more treatment fluid nozzles by a chuck associated with a rotatable or non-rotatable carrier. Wafer-supporting chucks are described for example in U.S. Pat. Nos. 4,903,717, 5,513,668, 6,435,200 and 6,536,454.

It is known that semiconductor wafer processing can result in unwanted buildup of static charge on the wafer surface. For example, in European Patent Application No. 1,077,473 it is described that buildup of static charge may be reduced by introducing carbon dioxide to a deionized water processing fluid so as to render the processing fluid electrically conductive. That method does not directly address the potential for static charge buildup in wafer-handling components that are not contacted by the electrically conductive processing fluid and, in any event, it precludes the use of relatively non-conductive processing fluids such as deionized water and 2-propanol. U.S. Pat. No. 7,335,090 relates to a spin chuck having holding pins which are formed of conductive resin and associated with a stainless steel shaft, which in turn is supported by radial metal bearings. However, the presence of a steel shaft creates a risk that a semiconductor wafer may be contaminated with iron, which should be avoided. Also, the connection between the stainless steel shaft and the resin pins is not specified, and connections through radial bearings likely are unreliable electrical contacts due, e.g., to the presence of bearing lubricants.

SUMMARY OF THE INVENTION

The present inventors have discovered that existing techniques for limiting static charge buildup in wafer-processing equipment are not fully satisfactory. For example, when equipment components include relatively non-conductive materials such as polyvinylidene fluoride (PVDF), polyetheretherketone (PEEK) or polytetra-fluoroethylene (PTFE), static charge may build up on those components, as well as on the wafer itself. The use of relatively non-conductive processing fluids such as deionized water or 2-propanol may also contribute to a buildup of static charge.

Static charge buildup can lead to an undesired accumulation of particulates and airborne contaminants. In some cases, electrostatic discharge may result at or near the wafer, which can damage or destroy components of an integrated circuit on the wafer.

As described in greater detail below, it has been discovered that unwanted static charge can be reduced or essentially eliminated by providing an electrically conductive pathway through the chuck, and in particular through the pin assemblies which support a wafer during processing, such that the chuck and wafer will be grounded.

The methods and apparatus of the invention are not limited to use on processing equipment for semiconductor wafers, and have application as well to equipment for treating surfaces of other materials, for example glass masters and mother panels used in manufacturing optical disks and LCD display panels, as well as for cleaning surfaces of processing chambers used during processing of the above-described substrates.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 3 is an enlarged view in perspective and partly in section of a pin assembly according to an embodiment of the invention;

DETAILED DESCRIPTION OF PREFERRED EMBODIMENTS

Figure 1:
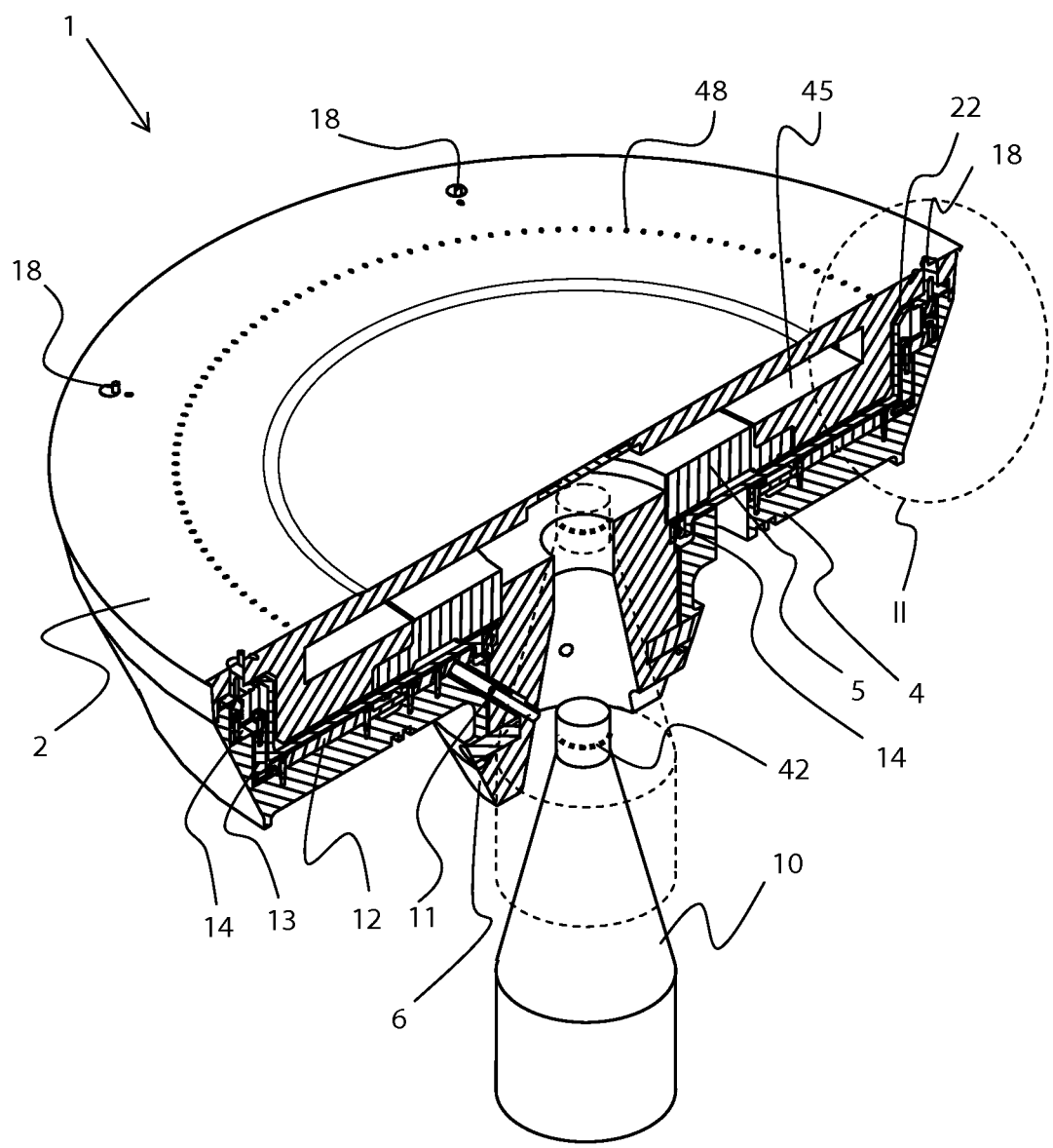
FIG. 1 is a view in perspective and partly in section illustrating a grounded chuck according to an embodiment of the invention.

In FIG. 1, a chuck (1), intended for holding a wafer-shaped article, especially during treatment with a processing fluid, is mounted on a spindle (10). The spindle (10) preferably is rotatable such that the chuck (1) can be set into rotation by the spindle (10). Such a rotatable chuck ("spin chuck") may be surrounded by a process chamber for single wafer wet processing of semiconductor wafers.

In this embodiment, the chuck (1) comprises a chuck body including a generally cup-shaped base body (4), a circular cover (2) and a nave (6).

The base body (4) includes a central aperture in which the nave (6) is seated. The nave (6) also includes a central aperture, the shape of which is selected to operatively engage the spindle (10). In the embodiment shown in FIG. 1, a frustoconical central aperture of the nave (6) corresponds with a complementary frustoconical spindle (10).

The cover (2) is seated via an annular rib at its outer periphery on the outer rim of the base body (4) such that an internal gap is provided between an upper surface of the base body (4) and a lower surface of the cover (2).

The cover (2) is generally C-shaped in its cross-section, such that it includes an essentially continuous upper part and an annular lower part. The upper and lower parts of the cover (2) are separated from one another so as to form an internal gas distribution chamber (45).

The annular lower part of the cover (2) mechanically engages a peripheral region at one end of the nave (6) via a rotary disc (5). Thus, when the chuck (1) is seated on the spindle (10), a distal end of the spindle (10) extends through the central aperture of the nave (6) and into the gas distribution chamber (45).

The spindle (10) preferably is hollow and includes a plurality of radially directed through-holes (42) at its distal end. Thus, pressurized gas delivered through the hollow spindle (10) may be directed via these through-holes (42) into the gas distribution chamber (45).

The cover (2) further includes an annularly arranged plurality of holes (48) extending from the gas distribution chamber to the upper surface of the cover (2). Accordingly, gas may be delivered through the hollow spindle (10), through-holes (42), gas distribution chamber (45) and holes (48) such that a wafer, when present, may be floated on a gas cushion during processing. Such gas may also be used to aid in securing a wafer to the chuck (1) operating on the Bernoulli principle.

A gear rim (22) is accommodated in the gap formed between the upper surface of the base body (4) and the lower surface of the cover (2). This gear rim (22) is coupled with the nave (6) and meshes via its radially outwardly extending peripheral teeth with a gear wheel (20) of each of a plurality of pin assemblies (18).

Figure 2:
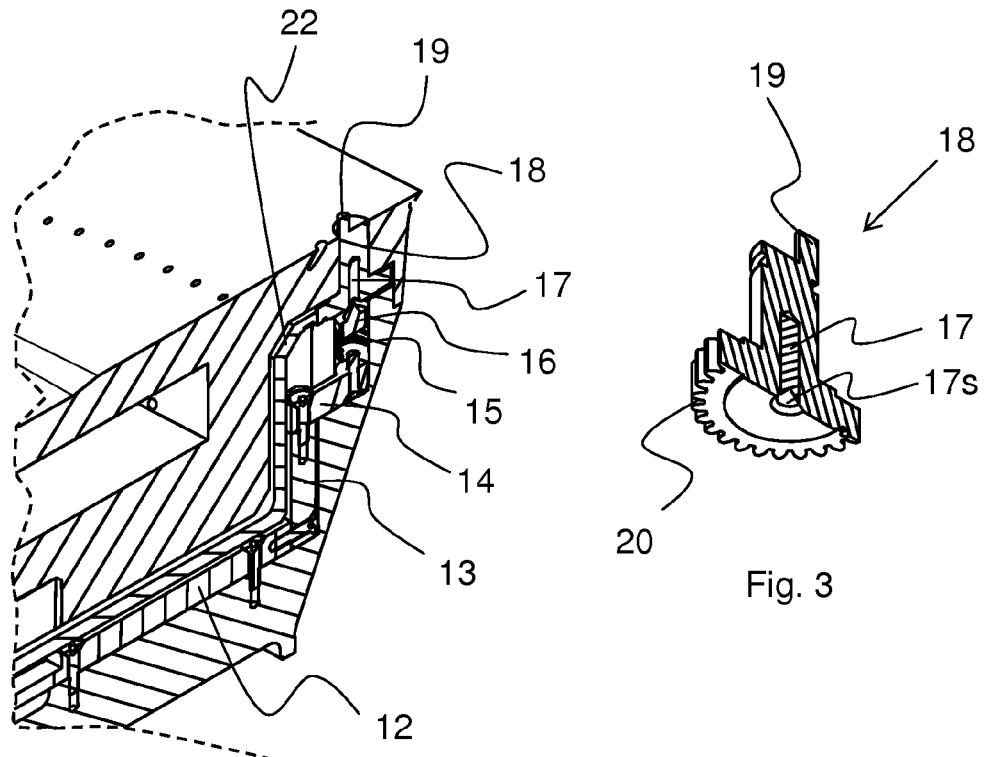
FIG. 2 is an enlarged detail view of area II of FIG. 1.

As shown for example in FIG. 2, each pin assembly (18) further includes a shaft extending from the gear wheel (20), which shaft is received rotatably in bores in the cover (2) and which carries a gripping pin (19) arranged eccentrically to the axis of rotation of the shaft. Each pin assembly (18) is urged upwardly toward cover (2) by a needle bearing (16) and associated helical spring (15), each of which is located within a recess formed within the outer upwardly extending peripheral edge of base body (4).

By turning the shafts of the pin assemblies (18) with the aid of the gear rim (22), the radial distance of the gripping pins (19) from the axis of rotation of the chuck (1) can be varied. Mechanisms for providing relative movement of a gear rim and a chuck body so as to rotate eccentrically located pins are known as described for example in U.S. Pat. Nos. 4,903,717 and 5,513,668. The gripping pins (19) serve as stops for the lateral retention of a wafer-shaped article (e.g. a semiconductor wafer, not shown) held on the chuck (1).

It is known to form chuck components, such as wafer-supporting pins, from material that is relatively inert to highly corrosive chemicals that are sometimes used in wafer processing. Such materials include polyvinylidene fluoride (PVDF), polyetheretherketone (PEEK) and polytetra-fluoroethylene (PTFE), among others. As noted, these non-conductive materials can result in an unwanted buildup of static charge, leading to risk of accumulation of contaminants or damage to electronic elements of an integrated circuit on the wafer due to electrostatic discharge.

In accordance with the present invention, one or more of the pin assemblies (18) are formed from static dissipative or electrically conductive material, such as conductive plastic. Consequently, static charge is dissipated through the conductive pin assemblies (18).

It will be appreciated that any relatively conductive plastic material having sufficiently conductive properties may be used. For example, suitable conductive plastic materials include polyvinylidene fluoride incorporating conductivity carbon, such as that which is marketed under the tradename SIMONA PVDF-EL which is reported to exhibit volume and surface resistivities of $\leq 10^6$ ohm*cm and $\leq 10^6$ ohm, respectively, under test method DIN IEC 60093. Other relatively conductive plastics include carbon filled ethylene tetrafluoroethylene as, for example, is marketed under the tradename Fluon LM-ETFE AH-3000, and carbon fiber filled perfluoroalkoxy as, for example, is marketed by Dupont under the tradename VESPEL CR-6110 which comprises a composite of carbon fiber sheets and polymer layers and is believed to exhibit volume and surface resistivities of about $10^{-1}$ ohm*cm and $10^{-1}$ ohm, respectively, in the direction of the layers and about $10^0$ ohm*cm and $10^1$ ohm, respectively, normal to the layers.

As is best shown in FIG. 2, an electrically conductive path is provided, extending from pin assemblies (18) through chuck (1) and to spindle (10).

Referring to FIG. 2, a conductive spring seat (14) is located below and in electrical contact with the helical spring (15). The helical spring (15) and needle bearing also are formed from electrically conductive material.

A conducting ring (13) is electrically connected (e.g., by metallic screws) to the spring seat (14). Also, one or more radially extending conductors (12) are joined to the upper surface of the base body (4) and are electrically connected (e.g., by metallic screws) to the conducting ring (13). As can be seen from FIG. 2, the spring seat (14), conducting ring (13) and radially extending conductors (12) are all located within the internal gap which is formed between the upper surface of the base body (4) and the lower surface of the cover (2).

A conducting member (11), preferably formed of metal, extends from the radially extending conductors (12) through the base body (4) and nave (6). The conducting member (11) preferably comprises a metal spring such that the above-described conductive pathway of the chuck (1) is electrically connected to the spindle, which also is conductive, when the chuck (1) is seated on the spindle (10).

Thus, chuck (1) provides an electrically conductive pathway leading through the pin assemblies (18), needle bearing (16), helical spring (15), spring seat (14), conducting ring (13), radial conductors (12) and conducting member (11). When seated on the spindle (10), the above-described conductive pathway continues via conducting member (11) to the spindle (10), which in turn may be electrically grounded, for example, by electrical connection to associated tool framing or other suitable electrically conductive sink.

The pin assemblies (18) also include an electrically conductive inlay (17), preferably formed of metal, located within a central bore of the pin assembly (18) and extending to the lower end thereof so as to physically and electrically contact the needle bearing (16), as shown in FIG. 3. The inlay (17) also includes a needle bearing seat (17s) for receiving the needle bearing (16) and thereby further enhancing the electrical contact between the pin assembly (18) and the needle bearing (16).

Figure 4:
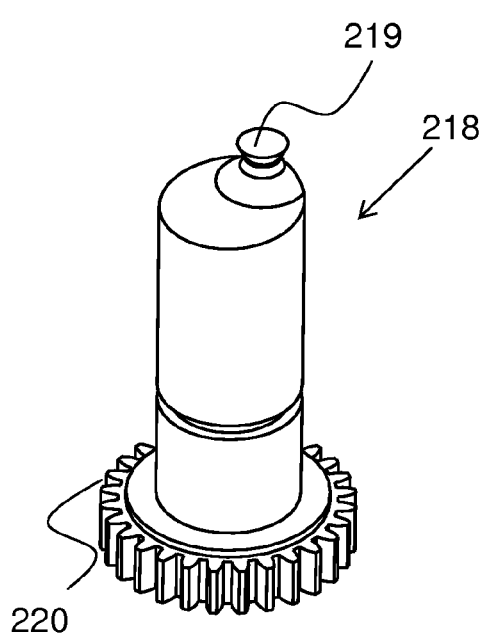
FIG. 4 is a perspective view of a pin assembly according to another embodiment of the invention.
Figure 5:
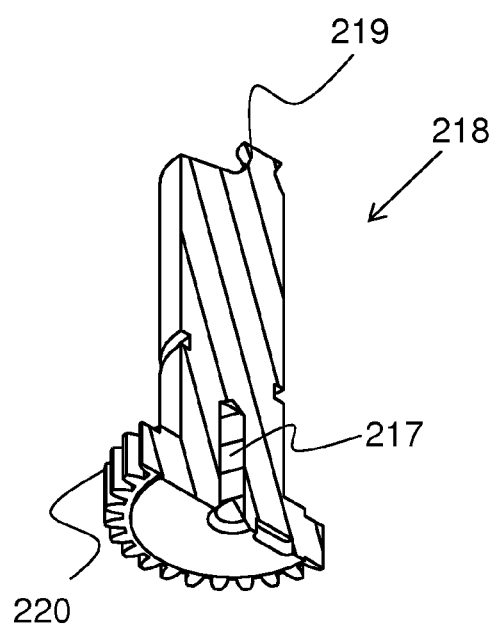
FIG. 5 is a view in perspective and partly in section of the pin assembly of FIG. 4.

In an alternative embodiment, pin assemblies (218) can be provided as shown in FIGS. 4 and 5. Pin assemblies (218) are essentially similar to what is shown in FIG. 3, including a gear wheel (220) and conductive inlay (217), except that the gripping pins (219) include a curved and reduced diameter waist. It will be appreciated that gripping pins (219) can provide both lateral and vertical support to a wafer, as is useful in conjunction with chucks that do not provide a gas cushion operating on the Bernoulli principle.

The above-described features of the present invention provide the surprising and heretofore unknown advantage of establishing an electrical pathway for dissipating static charge without requiring undue tightening of moving parts, such as gears, which would otherwise be required to establish a secure electrical contact and which would result in significantly increased friction and wear.

While the present invention has been described in connection with various illustrative embodiments thereof, it is to be understood that those embodiments should not be used as a pretext to limit the scope of protection conferred by the true scope and spirit of the appended claims.

What is claimed is:

1. Device for processing wafer-shaped articles, comprising a chuck adapted to maintain a wafer-shaped article in a predetermined orientation during a processing operation to be performed on the article, said chuck comprising a chuck body and a plurality of pin assemblies adapted and positioned relative to the chuck body so as to support a wafer-shaped article to be processed, wherein at least one of said pin assemblies is formed from a chemically inert material and includes an electrically conductive inlay at one end, said inlay being received in a recess formed in said pin assembly and being adapted to physically and electrically engage an electrically conductive needle bearing.

2. The device according to claim 1, wherein the chuck is a spin chuck surrounded by a process chamber for single wafer wet processing of semiconductor wafers.

3. The device according to claim 1, wherein said chuck is adapted to engage and be supported by a spindle, said chuck further comprising an electrically conductive pathway leading from said at least one pin assembly through said bearing element to said spindle.

4. The device according to claim 3, wherein said chuck body comprises an upper part joined to a lower part so as to form an internal gap therebetween, said electrically conductive pathway being provided within said internal gap.

5. The device according to claim 4, wherein the electrically conductive pathway comprises one or more conductive elements located within said internal gap.

6. The device according to claim 1, wherein said pin assemblies are positioned in a circular series about an area where a wafer-shaped article is to be positioned on the chuck, each of said pin assemblies being formed from a chemically inert material and including an electrically conductive inlay at one end, each said inlay being adapted to physically and electrically engage a bearing element.

7. The device according to claim 6, wherein said chuck is adapted to engage and be supported by a spindle, said chuck further comprising an electrically conductive pathway leading from said pin assemblies through said bearing elements to said spindle.

8. The device according to claim 7, wherein said electrically conductive pathway comprises an electrically conductive seat electrically connected to said bearing element, a radial conductor electrically connected to said seat, and a conducting member electrically connected to said radial conductor and adapted to be electrically connected to said spindle when said chuck engages said spindle.

9. A structure for use in devices for processing wafer-shaped articles, comprising a pin assembly, wherein said pin assembly is formed from a chemically inert conductive material and includes an electrically conductive inlay received in a recess formed at one end of said pin assembly, and wherein said pin assembly comprises a gear wheel formed in said chemically inert material and surrounding said recess, whereby said pin assembly can be driven by a gear mechanism meshing with said gear wheel and without contact between the gear mechanism and the inlay.

10. The structure according to claim 9, wherein said inlay is adapted to physically and electrically engage a bearing element.

11. The structure according to claim 10, wherein said bearing element is an electrically conductive needle bearing.

12. The structure according to claim 9, wherein said pin assembly comprises a gripping pin eccentrically arranged at one end of a shaft.

13. The structure according to claim 12, wherein said pin assembly further comprises a gear ring located at an end opposite to said gripping pin.

14. The structure according to claim 9, wherein said inlay is exposed by said pin assembly only through a central opening formed in a lower part of said pin assembly.

15. Pin assembly for use in a device for processing wafer-shaped articles, wherein said pin assembly is formed from a chemically inert conductive polymer material and includes an electrically conductive inlay received in a recess formed at one end of said pin assembly, wherein said pin assembly comprises a gear wheel formed in said chemically inert conductive polymer material and surrounding said recess, whereby said pin assembly can be driven by a gear mechanism meshing with said gear wheel and without contact between the gear mechanism and the inlay.

16. The structure according to claim 15, wherein said inlay is exposed by said pin assembly only through a central opening formed in a lower part of said pin assembly.

17. Device for processing wafer-shaped articles, comprising a chuck adapted to maintain a wafer-shaped article in a predetermined orientation during a processing operation to be performed on the article, said chuck comprising a chuck body and a plurality of pin assemblies adapted and positioned relative to the chuck body so as to support a wafer-shaped article to be processed, wherein at least one of said pin assemblies is formed from a chemically inert material and includes an electrically conductive inlay at one end, said inlay being received in a recess formed in said pin assembly and being adapted to physically and electrically engage a bearing element;

further comprising a gear mechanism engaging said plurality of pin assemblies so as to rotate each of said plurality of pin assemblies about its respective axis of rotation, said gear mechanism engaging the chemically inert material of said at least one pin assembly and being in non-contact with said inlay.

* * * * *